United States Patent [19]

Aoai et al.

[11] Patent Number: 5,707,777
[45] Date of Patent: *Jan. 13, 1998

[54] LIGHT-SENSITIVE COMPOSITION

[75] Inventors: Toshiaki Aoai; Tadayoshi Kokubo, both of Shizuoka-ken, Japan

[73] Assignee: Fuji Photo Film Co., Ltd., Minami-Ashigara, Japan

[*] Notice: The term of this patent shall not extend beyond the expiration date of Pat. No. 5,110,709.

[21] Appl. No.: 466,136

[22] Filed: Jun. 6, 1995

Related U.S. Application Data

[63] Continuation of Ser. No. 953,091, Sep. 29, 1992, abandoned.

[30] Foreign Application Priority Data

Oct. 1, 1991 [JP] Japan ..................... 3-253523

[51] Int. Cl.$^6$ ............................. G03F 7/038; G03F 7/004
[52] U.S. Cl. ..................... 430/270.1; 430/909; 430/910; 430/921; 430/326; 430/281.1; 430/292; 522/59; 522/54
[58] Field of Search ................. 430/270.1, 909, 430/910, 921, 326, 281.1; 522/59, 54

[56] References Cited

U.S. PATENT DOCUMENTS

| | | |
|---|---|---|
| 4,115,128 | 9/1978 | Kita . |
| 4,752,552 | 6/1988 | Aoai et al. . |
| 4,904,563 | 2/1990 | Aoai et al. . |
| 4,980,268 | 12/1990 | Bartmann et al. . |
| 5,035,979 | 7/1991 | Nguyen-Kim . |
| 5,110,709 | 5/1992 | Aoai et al. .............. 430/271 |

FOREIGN PATENT DOCUMENTS

| | | |
|---|---|---|
| 0 249 139 | 12/1987 | European Pat. Off. . |
| 0249139 | 12/1987 | European Pat. Off. . |
| 0424124 | 4/1991 | European Pat. Off. . |
| 3813722 | 11/1988 | Germany . |
| 3813772 | 11/1988 | Germany . |
| 4111060 | 10/1991 | Germany . |
| 61-166544 | 7/1986 | Japan . |
| 1-57777 | 12/1989 | Japan . |
| 2-248953 | 10/1990 | Japan . |

OTHER PUBLICATIONS

Patent Abstracts of Japan, "Formation of Pattern", vol. 8, No. 86, p. 269, Apr. 1984.

*Primary Examiner*—Cynthia Hamilton
*Attorney, Agent, or Firm*—Burns, Doane, Swecker & Mathis, LLP

[57] ABSTRACT

A positive-working light-sensitive composition which comprises:
(a) 0.5 to 80% by weight of a compound which has at least one group capable of being decomposed by an acid and whose solubility in an alkaline developer is increased by an acid;
(b) 0.01 to 20% by weight of a disulfone compound represented by the following formula (I);

$$R^1\text{—}SO_2\text{—}SO_2\text{—}R^2 \qquad (I)$$

wherein $R^1$ and $R^2$ may be the same or different and represent a substituted or unsubstituted alkyl, alkenyl or aryl group; and
(c) 5 to 99.49% by weight of a resin insoluble in water and soluble in an alkaline water,
wherein the compound of the component (a) has a molecular weight of not more than 2,000 and a boiling point of not less than 150° C. and wherein a film of the composition having a thickness of 1 μm has an optical density determined at 248 nm of not more than 1.4 before exposure to light and the optical density of the composition determined at 248 nm is reduced by exposure to light of 248 nm.

2 Claims, No Drawings

LIGHT-SENSITIVE COMPOSITION

This application is a continuation of application Ser. No. 07/953,091, filed Sep. 29, 1992, now abandoned.

BACKGROUND OF THE INVENTION

1. Field of the Invention

The present invention relates to a light-sensitive composition comprising a compound capable of being decomposed by an acid to form an alkali-soluble compound, an acid generator capable of releasing an acid by irradiation of actinic light or radiation and an alkali-soluble resin, which is sensitive to radiant rays such as ultraviolet rays, far ultraviolet rays, X-rays, electron beams, molecular beams, γ-rays and those originated from synchrotrons. More particularly, the present invention relates to a photoresist composition, in particular, a photoresist composition suitable for fine processing which exhibits high resolution and sensitivity as well as good storage stability.

2. Prior Art

There have generally been used, as positive-working photoresist compositions, those comprising an alkali-soluble resin and a naphthoquinone diazide compound as a light-sensitive substance. For instance, U.S. Pat. Nos. 3,666,473; 4,115,128 and 4,173,470 disclose novolak type phenol resins/substituted naphthoquinone diazide compounds and L. F. Thompson, "Introduction to Microlithography", No. 2, the 19th issue, pp. 112–121 (issued by ACS Publishing Company) discloses novolak resins comprising cresol-formaldehyde/trihydroxybenzophenone-1,2-naphthoquinonediazidosulfonic acid esters which are the most typical positive-working photoresist compositions.

The novolak resins are particularly useful as a binder in this application since they are soluble in an aqueous alkaline solution without accompanying swelling thereof and when using the resulting image as a mask for etching, they show high resistance to etching, in particular, plasma etching.

On the other hand, the naphthoquinone diazide compounds used as a light-sensitive substance, in themselves, serve as an agent for inhibiting dissolution of the novolak resin in an aqueous alkaline solution, but are decomposed by irradiation with light to give an alkali-soluble substance which can improve the solubility of the novolak resin in an alkali solution. Thus, the naphthoquinone diazide compounds are particularly useful as a light-sensitive substance for positive-working photoresists because of such a great property change upon irradiation with light.

From the foregoing standpoint, there have been developed and practically used various positive-working photoresists comprising novolak resins and naphthoquinone diazide light-sensitive substances and they have been used with remarkable success in processing of a minimum line width of about 1.5 to 2 μm.

However, the integration degree of IC's has become increasingly high and there has accordingly been required for the formation of very fine patterns having a line width of not more than 1 μm in the manufacture of semiconductor substrates for very large-scale integrated circuits (VLSI). These applications require the use of photoresists having, in particular, high resolution, high pattern-reproduction accuracy for obtaining correct reproduction of the pattern on a mask for exposure, high sensitivity from the viewpoint of achieving high productivity and excellent storage stability.

Attempts to achieve high resolution by increasing the content of quinone diazide light-sensitive groups have been reported. For instance, Japanese Unexamined Patent Publication (hereinafter referred to as "J.P. KOKAI") No. Sho 60-158440 discloses a method using a light-sensitive substance having a high triester content and J.P. KOKAI No. Sho 61-118744 proposes the use of a light-sensitive compound which has an increased number of quinone diazido light-sensitive groups per molecule.

However, these light-sensitive substances are insoluble in ordinary solvents, or, even if they are soluble therein, often precipitate during storing the photoresist composition and such precipitation is likely to cause various troubles in the photofabrication processes or processes for the production of devices and possibly reduces the production yield. In this respect, J.P. KOKAI No. Sho 61-260239 discloses a method in which an organic solvent having a solubility parameter ranging from 11 to 12 is added to the composition to prevent such precipitation of the light-sensitive substance. However, this method utilizes solvents such as dimethyl sulfoxide, which would impair the storage stability of the resist composition. Accordingly, the sensitivity and resolution thereof greatly vary depending on the storage time.

There has also been proposed the use of light having a short wavelength to achieve high resolution. More specifically, there have been investigated the use of, for instance, Deep-UV light rays (200 to 300 nm) and light rays from a KrF excimer laser (248 nm) instead of g-ray (436 nm) and i-ray (365 nm) conventionally used. However, in order to obtain a resist pattern having good shape by using the foregoing light rays having short wavelengths, the photoresist composition must have low absorption of light rays having a short wavelength such as those mentioned above and a high bleachability at a wavelength of the light used for exposure. In this respect, the conventional naphthoquinone diazide compounds absorb Deep-UV to a high extent, have low bleachability and are, accordingly, still insufficient for exposure to lights of short wavelengths.

Moreover, these quinone diazide compounds are used because they can form 5-membered cyclic carboxylic acids through irradiation with actinic light rays and are made alkali-soluble, but they are all insufficient in light-sensitivity. This is because these quinone diazide compounds cannot have by nature a quantum yield of not less than 1.

There have been proposed various methods for improving the light-sensitivity of light-sensitive compositions comprising quinone diazide compounds, but it is very difficult to enhance the light-sensitivity thereof while maintaining good development latitude thereof during development.

Alternatively, there have been proposed positive-working light-sensitive compositions free of quinone diazide compounds. An example thereof is a composition comprising a polymer compound carrying o-nitrocarbinol ester groups such as disclosed in Japanese Examined Patent Publication (hereinafter referred to as "J.P. KOKOKU") No. Sho 56-2696. In this case, however, the light-sensitivity is still insufficient for the same reason discussed above in connection with the quinone diazide compounds.

Further, there have been proposed methods for improving the light-sensitivity utilizing light-sensitive systems which can be activated by catalytic action. These methods are based on a known principle that the light-sensitive systems generate acids through photolysis which induce a secondary reaction to thus solubilize the portions exposed to light. Examples thereof include a combination of a compound capable of generating an acid through photolysis with an acetal or O, N-acetal compound (J.P. KOKAI No. Sho 48-89003), an orthoester or an amidoacetal compound (J.P.

KOKAI No. Sho 51-120714), a polymer carrying, in the main chain, acetal or ketal groups (J.P. KOKAI No. Sho 53-133429), an enol ether compound (J.P. KOKAI No. Sho 55-12995), an N-acyliminocarbonate compound (J.P. KOKAI No. Sho 55-126236), a polymer carrying, in the main chain, orthoester groups (J.P. KOKAI NO. Sho 56-17345), a silyl ester compound (J.P. KOKAI No. Sho 60-10247) or a silyl ether compound (J.P. KOKAI Nos. Sho 60-37549 and Sho 60-121446). In principle, these combinations have quantum yields of more than 1 and, accordingly, exhibit high light-sensitivity.

Also proposed are systems comprising a substance which is stable at room temperature over a long period of time but decomposed into alkali-soluble systems through heating in the presence of acids. Examples of such systems include combinations of compounds which generate acids upon exposure to light with esters or carbonic acid esters having tertiary or secondary hydrocarbon groups such as t-butyl and 2-cyclohexenyl groups such as disclosed in J.P. KOKAI Nos. Sho 59-45439, Sho 60-3625, Sho 62-229242 and Sho 63-36240; Polym. Eng. Sci., 23 (1983) p. 1012; ACS. Sym., 242 (1984) p. 11; Semiconductor World, the November issue (1987) p. 91; Macromolecules, 21 (1988) p. 1475; and SPIE, 920 (1988) p. 42. These systems can effectively be used for the irradiation with lights having a short wavelength since they exhibit higher sensitivity and lower absorption of Deep-UV light as compared with that of the naphthoquinone diazide/novolak resin systems. However, these compositions are still insufficient for the formation of resist patterns having satisfactory shapes since the acid-generating agents simultaneously used do not cause photobleaching. With respect to the compounds generating acids, for instance, J.P. KOKAI No. Sho 61-166544 discloses specific disulfone compounds as the compounds generating acids and German Patent No. 3,804,533 discloses combinations thereof with silyl ether compounds. However, those also have drawbacks, that is, the compounds of J.P. KOKAI No. Sho 61-166544 cannot obviate excessive absorption of Deep-UV light and the combinations of German Patent No. 3,804,533 do not impart sufficient alkali-developability of the exposed portions nor sufficient dissolution resistance of the unexposed portions in a developer.

SUMMARY OF THE INVENTION

An object of the present invention is to solve the foregoing problems and to provide a photoresist composition having high sensitivity and resolution in the production of, in particular, a semiconductor device. More specifically, the object of the present invention is to provide a photoresist composition which hardly absorb lights falling within the Deep-UV region, has high photobleachability in this region and can cope with light sources emitting light having a short wavelength.

We have conducted various studies to accomplish the foregoing object in the light of the desired properties of the photoresist composition discussed above and have completed the present invention.

According to the present invention, there is provided a positive-working light-sensitive composition which comprises:

(a) 0.5 to 80% by weight of a compound which has at least one group capable of being decomposed by an acid and whose solubility in an alkaline developer is increased by an acid;

(b) 0.01 to 20% by weight of a disulfone compound represented by the following formula (I);

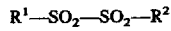

wherein $R^1$ and $R^2$ may be the same or different and represent a substituted or unsubstituted alkyl, alkenyl or aryl group; and (c) 5 to 99.49% by weight of a resin insoluble in water and soluble in an alkaline water, wherein the compound of the component (a) has a molecular weight of not more than 2,000 and a boiling point of not less than 150° C. and wherein a film of the composition having a thickness of 1 μm has an optical density determined at 248 nm of not more than 1.4 before exposure to light and the optical density of the composition determined at 248 nm is reduced by exposure to light of 248 nm.

The positive-working light-sensitive composition of the present invention is, in particular, used as a photoresist material. The photoresist is coated onto a semiconductor wafer or a substrate composed of, for example, glass, ceramics or metal in a thickness on the order of 0.5 to 3 μm by the spin coating or roller coating method. The coated photoresist is dried by heating and then a circuit pattern or the like is printed by irradiating the photoresist layer with, for instance, ultraviolet rays through a mask for exposure carrying a desired circuit pattern, followed by development to give a positive image. Further the substrate is etched through the positive image serving as an etching mask to form a desired pattern on the substrate.

The photoresist can be used in various fields, typical examples of which include semiconductor device-production processes such as formation of IC's, production of circuit boards for liquid crystal devices, thermal heads or the like and other photofabrication processes.

DESCRIPTION OF THE PREFERRED EMBODIMENTS

Each component of the positive-working light-sensitive composition of the present invention will be explained in more detail below.

Component (a): Compounds Capable of Being Decomposed by Acids

The component (a) used in the invention is a compound which has at least one group capable of being decomposed by the presence of an acid and whose solubility in an alkaline developer is increased by the presence of an acid.

According to preferred embodiments of the present invention, examples of the groups capable of being decomposed by the action of an acid include —COO—A and —Ar—O—B wherein A represents a group of;

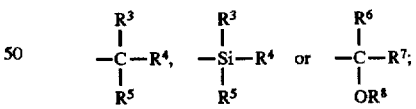

B represents group A or —CO—O—A; $R^3$, $R^4$, $R^5$, $R^6$ and $R^7$ may be the same or different and represent hydrogen atom or an alkyl, cycloalkyl, alkenyl or aryl group; $R^8$ represents an alkyl or aryl group, provided that at least two of the groups $R^3$, $R^4$ and $R^5$ represent groups other than hydrogen atom and that two of the groups $R^3$, $R^4$ and $R^5$ as well as $R^6$, $R^7$ and $R^8$ may be bonded together to form a ring; and Ar represents a divalent mono- or poly-cyclic aromatic group.

Preferred examples of the group capable of being decomposed by an acid include silyl ether groups, cumyl ester groups, acetal groups, enol ether groups, enol ester groups, tertiary alkyl ether groups, tertiary alkyl ester groups and tertiary alkyl carbonate groups.

The compounds of the component (a) should have a molecular weight of not more than 2,000, preferably not more than 1,200 and a boiling point of not less than 150° C.

Specific examples of the compound of the component (a) include silyl ether compounds disclosed in J.P. KOKAI Nos. Sho 60-37549 and Hei 1-106038; acetal compounds disclosed in J.P. KOKAI Nos. Sho 51-120714, Hei 1-106040 and Hei 1-106041; cumyl ester compounds disclosed in J.P. KOKAI No. 60-3265; enol ether compounds disclosed in J.P. KOKAI No. 55-12995; and t-butyl ether, t-butyl ester and t-butyl carbonate compounds disclosed in J.P. KOKAI No. 62-27827.

Specific examples of the compound of the component (a) further include monoketal derivatives of β-dicarbonyl compounds disclosed in J.P. KOKAI No. Hei 2-177031; β-keto-acid ester compounds disclosed in J.P. KOKAI No. Hei 2-181150; malonic acid ester compounds disclosed in J.P. KOKAI No. Hei 2-181151; spiro-orthocarbonate compounds disclosed in J.P. KOKAI No. Hei 3-107163; carbamate compounds disclosed in J.P. KOKAI No. Hei 3-153257; compounds having ammonium salt groups disclosed in European Patent No. 412,457; tetrahydropyranyl ether compounds disclosed in European Patent No. 424,124; and compounds disclosed in J.P. KOKAI No. Hei 3-17653. These compounds may be used alone or in combination. The disclosures of the patent documents aforementioned in connection with the component (a) are totally incorporated herein by reference.

Specific examples of compounds preferably used as the component (a) will be listed below, but the present invention is not restricted to these compounds.

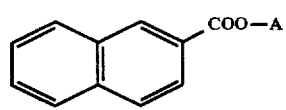
(a-1)

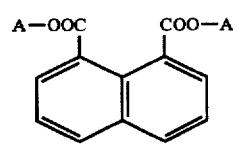
(a-2)

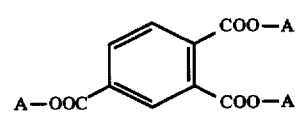
(a-3)

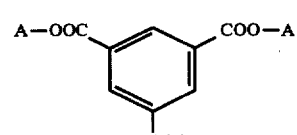
(a-4)

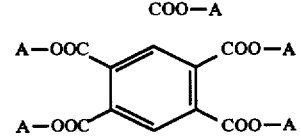
(a-5)

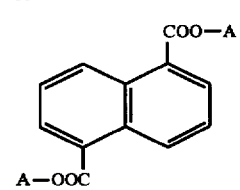
(a-6)

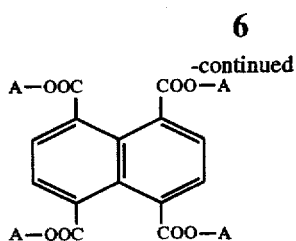
(a-7)

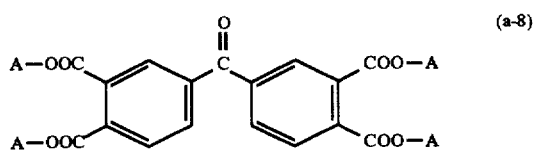
(a-8)

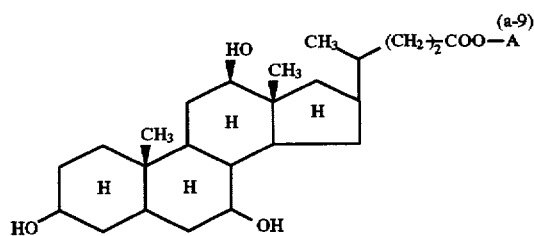
(a-9)

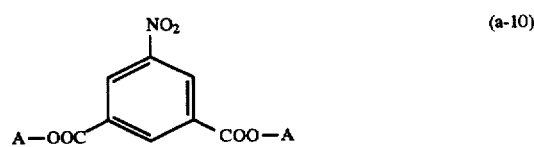
(a-10)

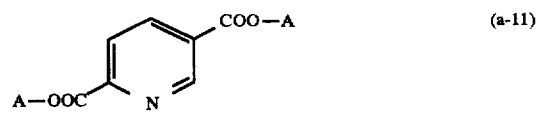
(a-11)

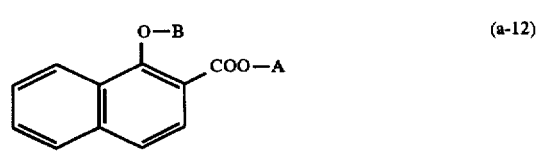
(a-12)

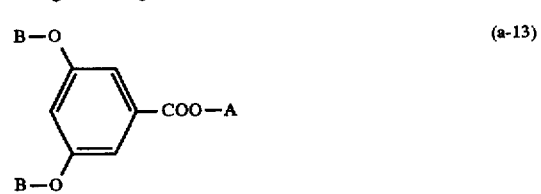
(a-13)

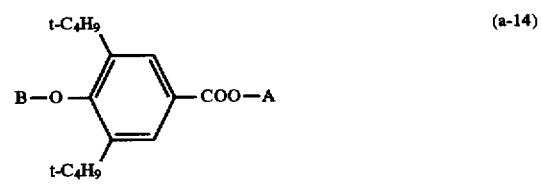
(a-14)

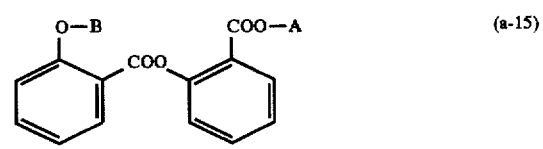
(a-15)

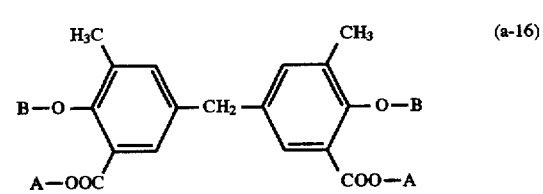
(a-16)

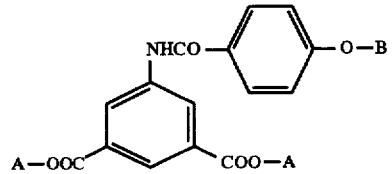 (a-17)
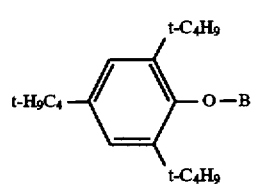 (a-18)
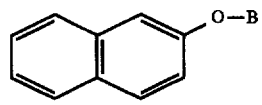 (a-19)
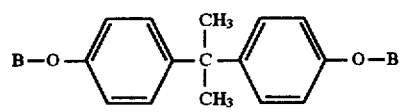 (a-20)
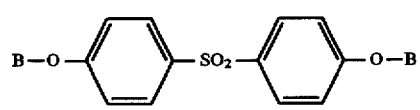 (a-21)
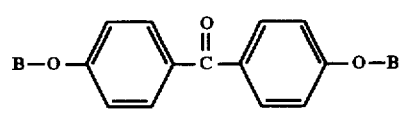 (a-22)
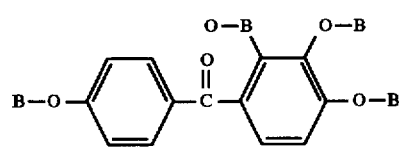 (a-23)
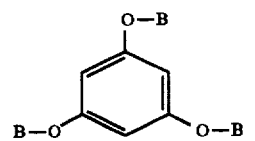 (a-24)
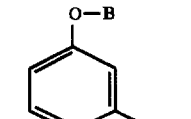 (a-25)
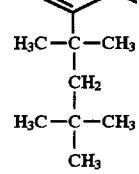 
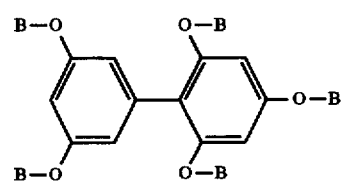 (a-26)
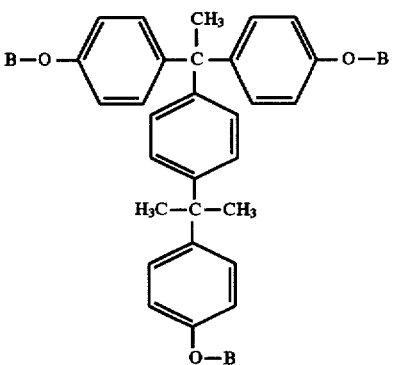 (a-27)
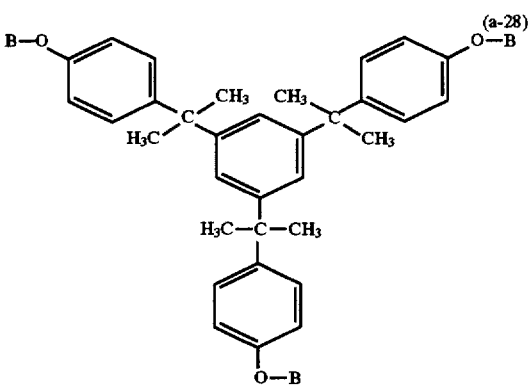 (a-28)
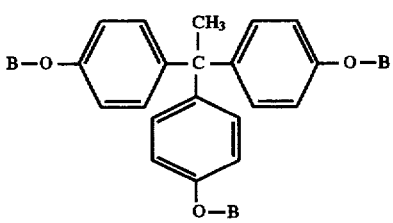 (a-29)
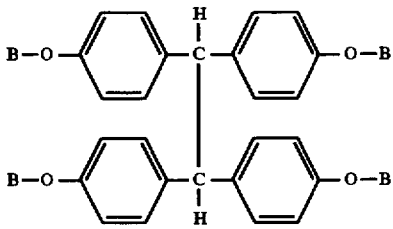 (a-30)
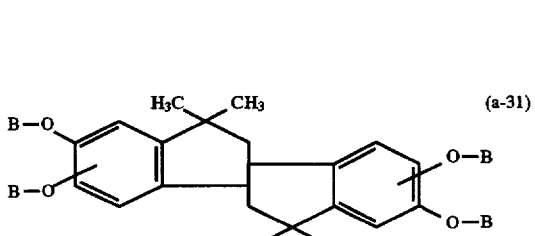 (a-31)

-continued

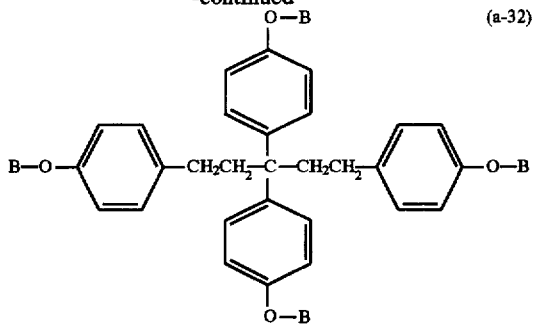
(a-32)

In the above formulae, A represents a hydrogen atom,

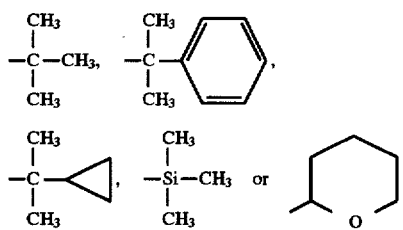

and B represents a group A or —CO—O—A, provided that at least one of groups A and B present in a single molecule should be a group other than a hydrogen atom.

The positive-working light-sensitive composition of the present invention comprises the component (a) in an amount ranging from 0.5 to 80% by weight, preferably 3 to 70% by weight and more preferably 5 to 50% by weight on the basis of the total weight of the solid contents of the composition.

Component (b): Disulfone Compounds

The component (b) used in the invention is a disulfone compound represented by the foregoing general formula (I).

In the formula (I), the alkyl group may be a linear, branched or cyclic one preferably having about 1 to about 10 carbon atoms. Specific examples thereof include methyl, ethyl, propyl, butyl, hexyl, octyl, decyl, isopropyl, isobutyl, tert-butyl, 2-ethylhexyl and cyclohexyl groups. The substituted alkyl group in the formula (I) may be, for instance, an alkyl group listed above which is substituted with one or more halogen atoms such as chlorine atom, alkoxy groups having 1 to 6 carbon atoms such as methoxy, aryl groups such as phenyl and aryloxy groups such as phenoxy. Specific examples of the substituted alkyl group include monochloromethyl, dichloromethyl, trichloromethyl, bromomethyl, 2-chloroethyl, 2'-bromoethyl, 2-methoxyethyl, 2-ethoxyethyl, phenylmethyl, naphthylmethyl and phenoxymethyl groups.

The alkenyl group in the formula (I) is, for instance, a vinyl group and the substituted alkenyl group is, for instance, a vinyl group which is substituted with one or more alkyl groups such as methyl and aryl groups such as phenyl. Specific examples of the substituted alkenyl group include 1-methylvinyl, 2-methylvinyl, 1,2-dimethylvinyl, 2-phenylvinyl, 2-(p-methylphenyl)vinyl, 2-(p-methoxyphenyl)vinyl, 2-(p-chlorophenyl)vinyl and 2-(o-chlorophenyl)vinyl groups.

The aryl group in the formula (I) is preferably mono- or dicyclic one such as phenyl, α-naphthyl and β-naphthyl groups. The substituted aryl group may be, for example, an aryl group such as those listed above which is substituted with one or more halogen atoms such as chlorine atom, alkyl group having 1 to 6 carbon atoms such as methyl and ethyl, alkoxy group having 1 to 6 carbon atoms such as methoxy and ethoxy, nitro, phenyl, carboxy, hydroxyl, amido, imido and cyano groups. Specific examples thereof are 4-chlorophenyl, 2-chlorophenyl, 4-bromophenyl, 4-nitrophenyl, 4-hydroxyphenyl, 4-phenylphenyl, 4-methylphenyl, 2-methylphenyl, 4-ethylphenyl, 4-methoxyphenyl, 2-methoxyphenyl, 4-ethoxyphenyl, 2-carboxyphenyl, 4-cyanophenyl, 4-methyl-1-naphthyl, 4-chloro-1-naphthyl, 5-nitro-1-naphthyl, 5-hydroxy-1-naphthyl, 6-chloro-2-naphthyl, 4-bromo-2-naphthyl and 5-hydroxy-2-naphthyl groups.

The disulfone compounds represented by the general formula (I) and used in the invention can be prepared according to various methods such as those disclosed in G. C. Denser, Jr. et al., J. Org. Chem., 31 (1966) pp. 3418–3419; T. P. Hilditch, J. Chem. Soc., 93 (1908) pp. 1524–1527; and O. Hinsberg, Berichte der Deutschen Chemischen Gesellschaft, 49 (1916) pp. 2593–2594 of which disclosures are totally incorporated herein by reference. More specifically, the disulfone compounds are prepared from sulfinic acids represented by the following general formula (II) by using cobalt sulfate in an aqueous sulfuric acid solution, from sulfonic acid chlorides represented by the following general formula (III) by using ethyl xanthogenate or from the sulfinic acids represented by the formula (II) and the sulfonic acid chlorides represented by the formula (III) by reacting them under basic conditions:

(II)

(III)

In the above formulae, $R^1$ and $R^2$ have the same meanings as those defined above in connection with the general formula (I).

Specific examples of the compounds of the formula (I) used in the invention will be listed below.

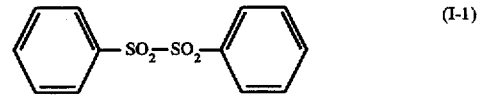
(I-1)

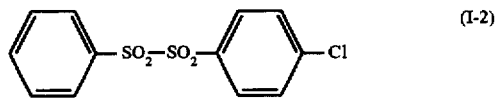
(I-2)

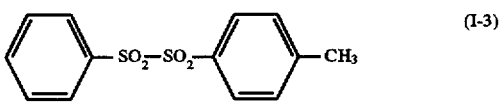
(I-3)

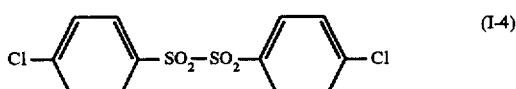
(I-4)

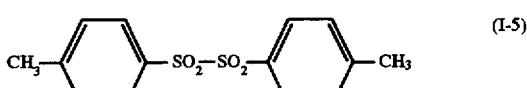
(I-5)

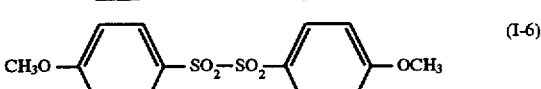
(I-6)

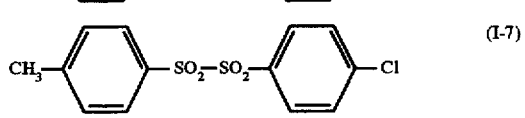
(I-7)

-continued
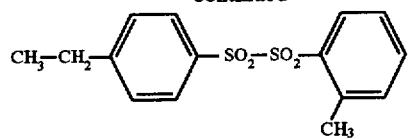 (I-8)
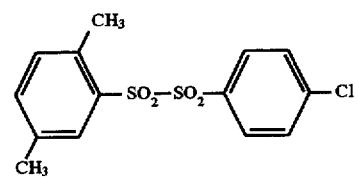 (I-9)
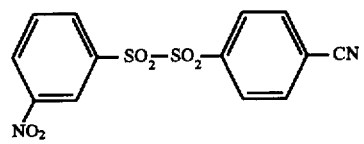 (I-10)
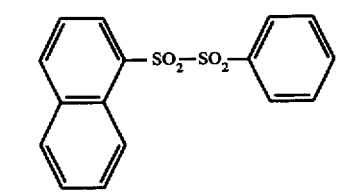 (I-11)
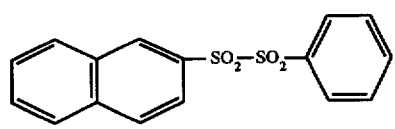 (I-12)
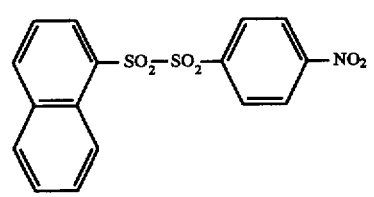 (I-13)
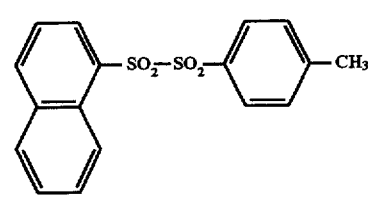 (I-14)
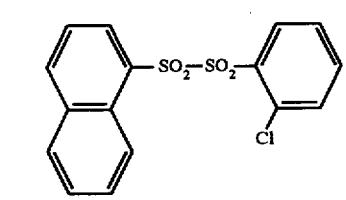 (I-15)
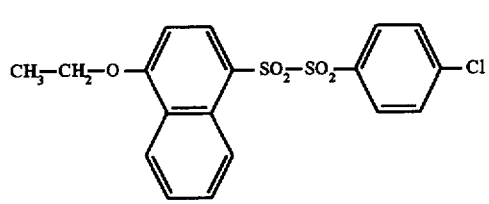 (I-16)
-continued
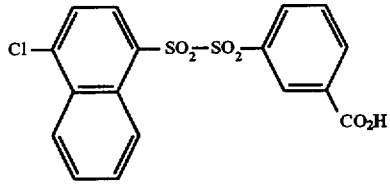 (I-17)
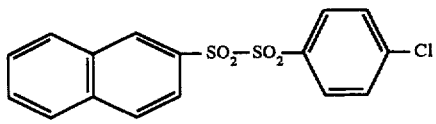 (I-18)
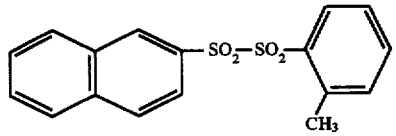 (I-19)
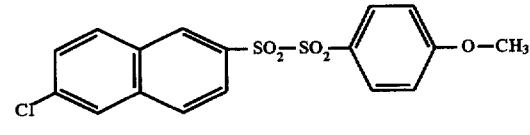 (I-20)
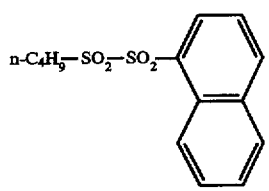 (I-21)
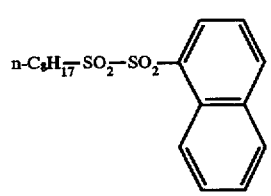 (I-22)
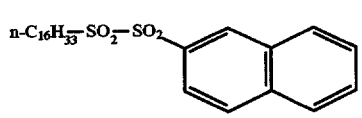 (I-23)
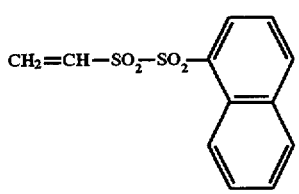 (I-24)
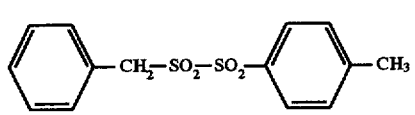 (I-25)
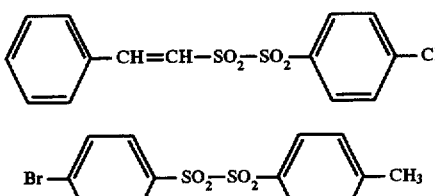 (I-26)
(I-27)

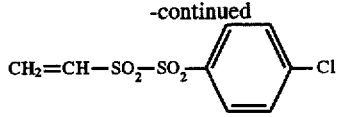 (I-28)

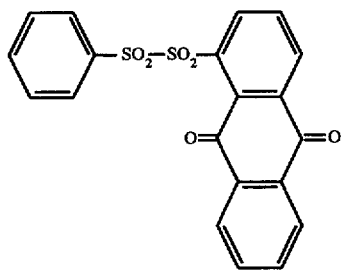 (I-29)

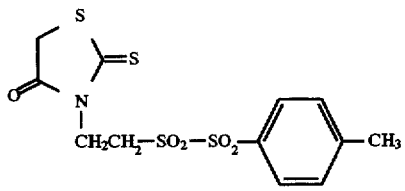 (I-31)

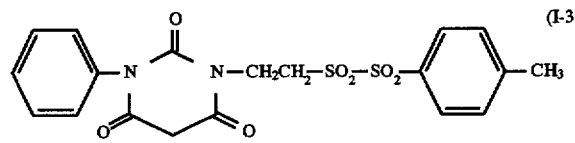 (I-33)

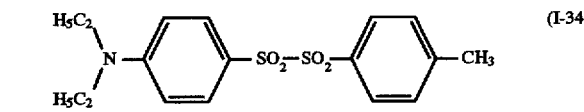 (I-34)

The light-sensitive composition of the invention may comprise at least one disulfone compound of the formula (I) in an amount ranging from 0.01 to 20% by weight, preferably 0.5 to 15% by weight and more preferably 1 to 10% by weight on the basis of the total weight of the solid contents of the composition.

Component (c): Alkali-Soluble Resins

The alkali-soluble resins used in the positive-working light-sensitive composition of the present invention are preferably polymers having groups carrying an acidic hydrogen atom whose pKa value is not more than 11, such as phenolic hydroxyl group, carboxylate residue, sulfonate residue, imido group, sulfonamido group, N-sulfonylamido group, N-sulfonylurethane group and active methylene group. Examples of preferred alkali-soluble polymers are novolak type phenol resins such as phenol/formaldehyde resin, o-cresol/formaldehyde resin, m-cresol/formaldehyde resin, p-cresol/formaldehyde resin and xylenol/formaldehyde resin; and co-condensates thereof. The foregoing phenolic resins may be used in combination with condensates of phenol or cresol substituted with an alkyl group having 3 to 8 carbon atoms and formaldehyde such as t-butylphenol/formaldehyde resin such as disclosed in J.P. KOKAI No. Sho 50-125806. Alkali-soluble polymers usable in the invention further include polymers comprising copolymerized units derived from phenolic hydroxyl group-containing monomers such as N-(4-hydroxyphenyl) methacrylamide; homopolymers or copolymers of p-hydroxystyrene, o-hydroxystyrene, m-isopropenylphenol, p-isopropenylphenol and the like; and these polymers which are partially etherified or partially esterified.

Preferred alkali-soluble resins also include polymers comprising copolymerized units derived from carboxyl group-containing monomers such as (meth)acrylic acid; carboxyl group-containing polyvinyl acetal resins disclosed in J.P. KOKAI No. Sho 61-267042; and carboxyl group-containing polyurethane resins disclosed in J.P. KOKAI No. Sho 63-124047.

Alkali-soluble polymers usable in the invention likewise include polymers comprising copolymerized units derived from N-(4-sulfamoylphenyl)methacrylamide, N-phenylsulfonyl methacrylamide and maleimide; and polymers comprising copolymerized units derived from active methylene group-containing monomers disclosed in J.P. KOKAI No. Sho 63-127237. The disclosures of the patent documents above-mentioned in connection with the component (c) are totally incorporated herein by reference.

These alkali-soluble polymers may be used alone or in combination. The light-sensitive composition of the invention may comprise the component (c) in an amount ranging from 5 to 99. 49% by weight, preferably 10 to 95% by weight and more preferably 30 to 90% by weight on the basis of the total weight of the solid contents of the composition.

In the light-sensitive composition of the present invention, the components (a), (b) and (c) are used in amounts defined above, but these components are combined in such a manner that a film of the composition having a thickness of 1 μm has an optical density of not more than 1.4, preferably not more than 1.3, more preferably not more than 1.0 determined at a wavelength of 248 nm before exposure to light and that the optical density thereof as determined at a wavelength of 248 nm is reduced by exposure to light.

Other Preferred Components

The positive-working light-sensitive composition of the invention may optionally comprise other additives such as dyes, pigments, plasticizers, compounds capable of increasing photolysis-efficiency of the composition (so-called sensitizers) and the like in addition to the foregoing essential components.

Examples of such sensitizers usable in the invention include benzoin, benzoin methyl ether, benzoin ethyl ether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, thioxanthone, benzyl, dibenzalacetone, p-(dimethylamino)phenyl styryl ketone, p-(dimethylamino) phenyl p-methylstyryl ketone, benzophenone, p-(dimethylamino)benzophenone (or Michler's ketone), p-(diethylamino)benzophenone and benzanthrone. Particularly preferred results can be obtained when Michler's ketone is used among others.

Examples of preferred sensitizers usable in the invention further include compounds represented by the following general formula (IV) as disclosed in J.P. KOKOKU No. Sho 51-48516:

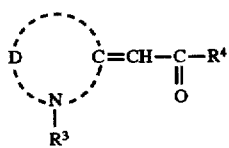 (IV)

wherein $R^3$ represents an alkyl group such as methyl, ethyl or propyl group or a substituted alkyl group such as 2-hydroxyethyl, 2-methoxyethyl, carboxymethyl or 2-carboxyethyl group; $R^4$ represents an alkyl group such as a methyl or ethyl group; or an aryl group such as phenyl, p-hydroxyphenyl, naphthyl or thienyl group; and D represents a non-metallic atomic group required for forming a nitrogen atom-containing heterocyclic ring and commonly used in the cyanine dyes and specific examples thereof include benzothiazoles such as benzothiazole, 5-chlorobenzothiazole and 6-chlorobenzothiazole; naphthothiazoles such as α-naphthothiazole and β-naphthothiazole; benzoselenazoles such as benzoselenazole, 5-chlorobenzoselenazole and 6-methoxybenzoselenazole; naphthoselenazoles such as α-naphthoselenazole and β-naphthoselenazole; benzoxazoles such as benzoxazole, 5-methylbenzoxazole and 5-phenylbenzoxazole; and naphthoxazoles such as α-naphthoxazole and β-naphthoxazole.

Specific examples of the compounds of the formula (IV) are those having chemical structures comprising these D, $R^3$ and $R^4$ and a variety of such compounds have been known. Therefore, the compounds of the formula (IV) may appropriately be selected from those known ones.

Preferred sensitizers further include, for instance, those disclosed in U.S. Pat. No. 4,062,686 such as 2-[bis(2-furoyl) methylene]-3-methylbenzothiazoline, 2-[bis(2-thienoyl) methylene]-3-methylbenzothiazoline and 2-[bis(2-furoyl) methylene]-3-methylnaphtho[1,2-d]thiazoline.

Dyes may be used as coloring agents and preferred dyes are oil soluble dyes and basic dyes. Specific examples thereof include Oil Yellow #101, Oil Yellow #130, Oil Pink #312, Oil Green BG, Oil Blue BOS, Oil Blue #603, Oil Black BY, Oil Black BS, Oil Black T-505 (all of these being available from Orient Chemical Industries, Co., Ltd.); Crystal Violet (CI 42555), Methyl Violet (CI 42535), Rhodamine B (CI 45170B), Malachite Green (CI 42000) and Methylene Blue (CI 52015).

The light-sensitive composition of the invention may further comprise cyclic acid anhydrides for further improving sensitivity; printing out agents for obtaining a visible image immediately after imagewise exposure; and other fillers. Examples of the cyclic acid anhydrides are phthalic anhydride, tetrahydrophthalic anhydride, hexahydrophthalic anhydride, 3,6-endoxy-$\Delta^4$-tetrahydrophthalic anhydride, tetrachlorophthalic anhydride, maleic anhydride, chloromaleic anhydride, α-phenylmaleic anhydride, succinic anhydride and pyromellitic anhydride. The sensitivity of the composition can be increased about 3 times at most by addition of these cyclic acid anhydrides in an amount ranging from 1 to 15% by weight on the basis of the total weight of the solid contents of the composition.

The printing out agents for obtaining a visible image immediately after imagewise exposure are represented by combinations of light-sensitive compounds capable of releasing acids through exposure to light with organic dyes capable of forming salts. Specific examples thereof include combinations of o-naphthoquinonediazido-4-sulfonic acid halogenides with salt-forming organic dyes disclosed in J.P. KOKAI Nos. Sho 50-36209 and Sho 53-8128; and combinations of trihalomethyl compounds with salt-forming organic dyes disclosed in J.P. KOKAI Nos. Sho 53-36223 and Sho 54-74728.

Solvents

When the positive-working light-sensitive composition of the invention is used as a photoresist material for processing semiconductor devices or the like, the composition is used in the form of a solution in a solvent. Examples of usable solvents include ethylene dichloride, cyclohexanone, methyl ethyl ketone, methanol, ethanol, propanol, ethylene glycol monomethyl ether, 1-methoxy-2-propanol, ethylene glycol monoethyl ether, 2-methoxyethyl acetate, 2-ethoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, toluene and ethyl acetate, which may be used alone or in combination. The concentration of the foregoing components (the sum of the solid contents inclusive of additives) ranges from 2 to 50% by weight.

Actinic Light Rays or Radiant Rays

Light sources of actinic rays used for exposing the light-sensitive composition of the invention include mercury lamps, metal halide lamps, xenon lamps, chemical lamps and carbon arc lamps; and examples of radiant rays usable in the invention include electron beams, X-rays, ion beams and far ultraviolet rays. Preferred actinic light rays and the radiant rays for the photoresist include g-ray, i-ray and Deep-UV rays. Alternatively, exposure of the light-sensitive composition of the present invention can be performed by scanning or pulse exposure of a high density energy beam such as laser beams and electron beams. Examples of laser light sources are helium.neon laser, argon laser, krypton laser, helium.cadmium laser and KrF excimer laser.

Developer

Preferred developers for the positive-working light-sensitive composition of the present invention is an aqueous solution of an inorganic or organic alkaline agent. Examples of these inorganic or organic alkaline agents are sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate and aqueous ammonia; and tetraalkyl ammonium hydroxides, which may be used alone or in combination. The concentration of these alkaline agents ranges from 0.1 to 10% by weight and preferably 0.5 to 5% by weight.

In addition, these aqueous alkaline solutions may optionally comprise other additives, for example, surfactants and organic solvents such as alcohols.

The positive-working light-sensitive composition of the present invention shows high sensitivity, good adaptability to light sources emitting lights having a short wavelength of the Deep-UV region and excellent resolution.

EXAMPLES

The present invention will be explained in more detail with reference to the following non-limitative working Examples.

Example 1

In 6.0 g of dimethylacetamide (hereinafter referred to as "DMAc"), there were dissolved 2 g of m-/p-cresol novolak resin having a molecular weight of 3380 and an m/p charge ratio of 50/50 and 0.2 g of the disulfone compound (I-14). Then, the resulting solution was filtered through a membrane filter having a pore size of 0.4 μm to give a light-sensitive composition. The optical density of the composition was determined at a wavelength of 248 nm and it was found to be about 1.2 μm$^{-1}$ before exposure to light, but it was reduced to about 0.9 μm$^{-1}$ after exposure to light.

The foregoing light-sensitive composition was applied onto a 3 inch bare silicon wafer which had been treated with hexamethyldisilazane and then the coated layer was prebaked for 90 seconds on a hot plate maintained at 100° C. to give a coated film having a thickness of about 8,000 Å. The exposure was performed by PLA 501F Contact Aligner (available from Canon Inc.) equipped with a low pressure mercury lamp as a light source and a band-pass filter capable of transmitting a far ultraviolet ray having a wavelength of 254 nm. After exposing to light in contact mode, the silicon wafer was subjected to paddle development for 60 seconds in an about 1.43% aqueous solution of tetramethylammonium hydroxide (hereinafter referred to as "TMAH"). As a result, positive images having a rate of remaining film of 95% was obtained.

The light-sensitive composition was found to have an Eta sensitivity of about 50 mj/cm$^2$ and a resolution of 0.75 µm L/S.

Example 2

An m-/p-cresol novolak resin having a molecular weight of 3400 and an m/p charge ratio of 50/50 was mixed with an alkali-soluble resin represented by the following formula:

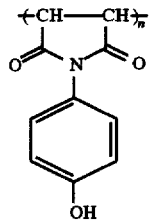

having a molecular weight of about 8,000 in a rate of 60:40 (1.2 g and 0.8 g respectively) and 0.2 g (10% with respect to the resins) of the disulfone compound (I-7) was added to the mixture. The resulting mixture was dissolved in 7.9 g of DMAc. After completely dissolving the mixture, the solution was filtered through a membrane filter having a pore size of 0.4 µm in the same manner as used in Example 1 to give a light-sensitive composition. The optical density of the resulting composition was determined at a wavelength of 248 nm and was found to be about 1.0 µm$^{-1}$ before exposure to light and it was reduced to 0.8 µm$^{-1}$ after exposure to light.

A coated film of about 8,000 Å thickness was formed from the composition on a silicon wafer in the same manner as used in Example 1. After exposure to light, the coated film was developed for 45 seconds by paddle-development in a developer of 1.19% aqueous solution of TMAH. As a result, positive images having a rate of remaining film of about 90% was formed.

The light-sensitive composition had a resolution of 0.75 µm L/S and an Eta sensitivity of about 30 mj/cm$^2$.

Example 3

In 7.5 g of DMAc, there were dissolved 1.8 g of an m-/p-cresol novolak resin having a molecular weight of about 6,000 and an m/p charge ratio of 60:40, 0.8 g of the compound (a-4) [A=—C(CH$_3$)$_2$(C$_6$H$_5$)] and 0.12 g of the disulfone compound (I-16) and then the resulting solution was filtered through a membrane filter having a pore size of 0.4 µm to give a light-sensitive composition. The optical density of the resulting composition was determined at a wavelength of 248 nm and was found to be about 0.93 µm$^{-1}$ before exposure to light and it was reduced to 0.81 µm$^{-1}$ after exposure to light.

A coated film of 8,000 Å thickness was formed from the composition on a silicon wafer in the same manner as used in Example 1. After exposure to light using the exposure machine described in Example 1, the coated film was developed for 45 seconds by paddle-development in a developer of 1.19% aqueous solution of TMAH. As a result, positive images having a rate of remaining film of about 92% was formed.

The light-sensitive composition had a resolution of 0.7 µm L/S and an Eta sensitivity of 25 mj/cm$^2$.

Example 4

The same procedures as used in Example 3 were repeated except that 0.3 g of the disulfone compound (I-13) was used in stead of the disulfone compound (I-16) used in Example 3 to give a light-sensitive composition. The optical density of the resulting composition was determined at a wavelength of 248 nm and was found to be about 1.1 µm$^{-1}$ before exposure to light and it was reduced to 0.92 µm$^{-1}$ after exposure to light.

The coated film was developed in the same manner as used in Example 1 using a developer comprising 1.19% aqueous solution of TMAH and the image-forming ability of the composition was evaluated. As a result, the light-sensitive composition had a resolution of 0.8µm L/S and an Eta sensitivity of 75 mj/cm$^2$.

Examples 5 to 10

There were mixed the compound (a-27) (B=—COO-t-C$_4$H$_9$) [Component (a)], a disulfone compound shown in Table 1 [Component (b)] and an m/p-cresol/novolak resin (m/p=50/50; weight-average molecular weight=6,000) [Component (c)] in various ratios listed in Table 1 to give light-sensitive compositions. The resulting compositions were coated and then exposed to light in the same manner as used in Example 1 and then the coated films were post-baked at 90° C. for 90 seconds. After development under the conditions shown in Table 2, the image-forming ability of these compositions were evaluated in the same manner as used in Example 1.

The results thus obtained are summarized in Table 3. All of these compositions could resolve the minimum mask pattern size of 0.7 µm.

TABLE 1

| Ex. | Mixing Ratio | | Disulfone | Optical Density (µm$^{-1}$) | |
|---|---|---|---|---|---|
| No. | (c)/(a) | (a)/(b) | Compound | Unexposed | Exposed |
| 5 | 80/20 | 8/1 | I-11 | 1.05 | 0.99 |
| 6 | 70/30 | 8/1 | I-11 | 0.95 | 0.88 |
| 7 | 60/40 | 8/1 | I-11 | 0.88 | 0.78 |
| 8 | 80/20 | 8/1 | I-15 | 1.07 | 1.01 |
| 9 | 70/30 | 8/1 | I-15 | 0.99 | 0.90 |
| 10 | 60/40 | 8/1 | I-15 | 0.90 | 0.78 |

TABLE 2

| Ex. No. | Developer | Developing Time (sec) |
|---|---|---|
| 5 | TMAH, 2.38% | 30 |
| 6 | " | 30 |
| 7 | " | 40 |
| 8 | TMAH, 1.67% | 30 |
| 9 | " | 40 |
| 10 | " | 40 |

TABLE 3

| Ex. No. | Eta (mj/cm²) | Resolution (μm) | Rate of Remaining Film (%) |
|---|---|---|---|
| 5 | 20 | 0.7 | 91.0 |
| 6 | 35 | 0.7 | 92.0 |
| 7 | 40 | 0.7 | 93.0 |
| 8 | 25 | 0.7 | 89.0 |
| 9 | 30 | 0.7 | 89.0 |
| 10 | 35 | 0.7 | 91.0 |

What is claimed is:

1. A positive working photosensitive composition which comprises:
   (a) 0.5 to 80% by weight, based on the total weight of solids in the composition, of a compound which has (i) at least one group capable of being decomposed by an acid, said group being selected from the group consisting of tertiary alkyl ether groups, tertiary alkyl ester groups and tertiary alkyl carbonate groups, (ii) a molecular weight of not more than 1,200, and (iii) a boiling point of not less than 150° C.;
   (b) 0.01 to 20% by weight, based on the total weight of solids in the composition, of a disulfone compound represented by the following formula (I):

$$R^1-SO_2-SO_2-R^2 \quad (I);$$

wherein $R^1$ and $R^2$ independently represent a substituted or unsubstituted alkyl, alkenyl or aryl group; and
   (c) 5 to 99.49% by weight, based on the total weight of solids in the composition, of a resin insoluble in water and soluble in an alkaline water, wherein a film of the composition having a thickness of 1 μm has an optical density determined at 248 nm of not more than 1.4 before exposure to light and the optical density of the composition determined at 248 nm is reduced by exposure to light of 248 nm, wherein the compound of the component (a) is selected from the following compounds:

(a-1)

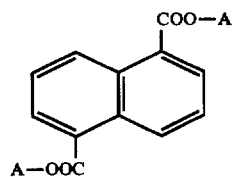

(a-2)

(a-3)

(a-4)

(a-5)

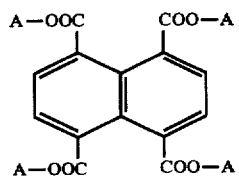

(a-6)

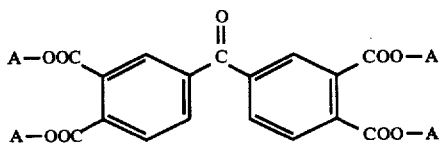

(a-7)

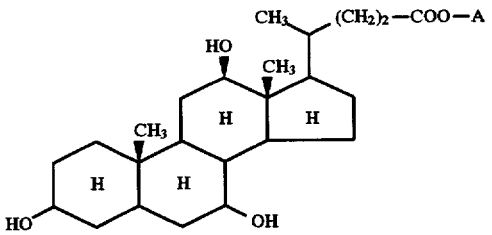

(a-8)

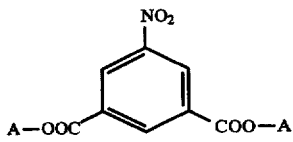

(a-9)

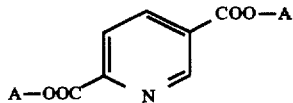

(a-10)

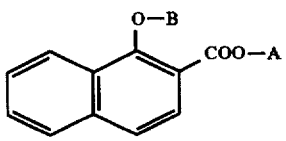

(a-11)

(a-12)

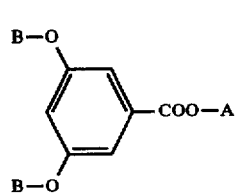

(a-13)

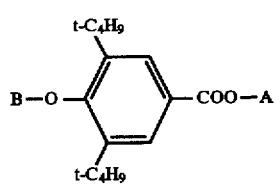

(a-14)

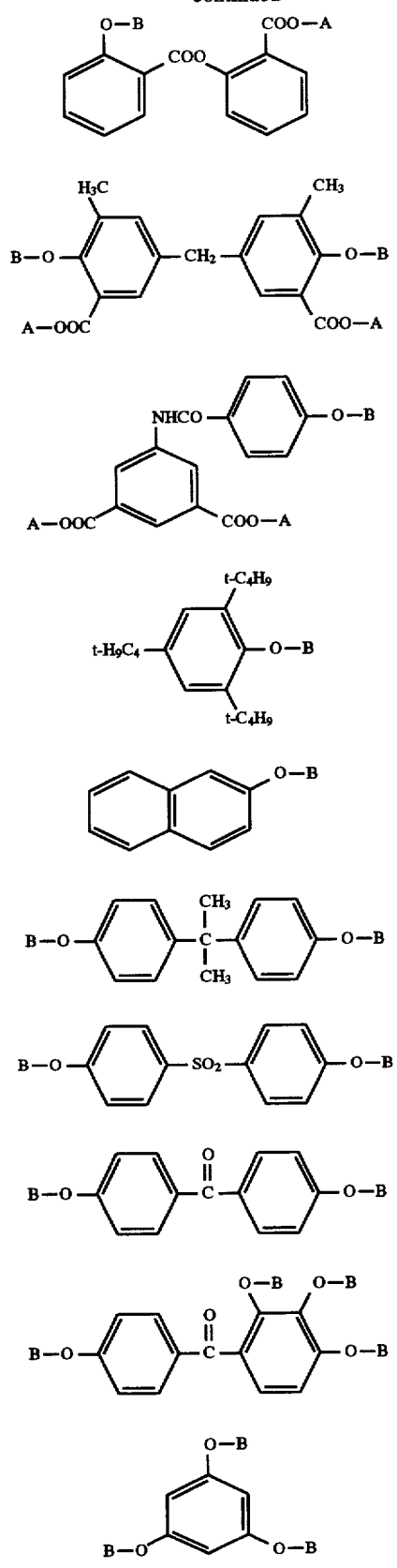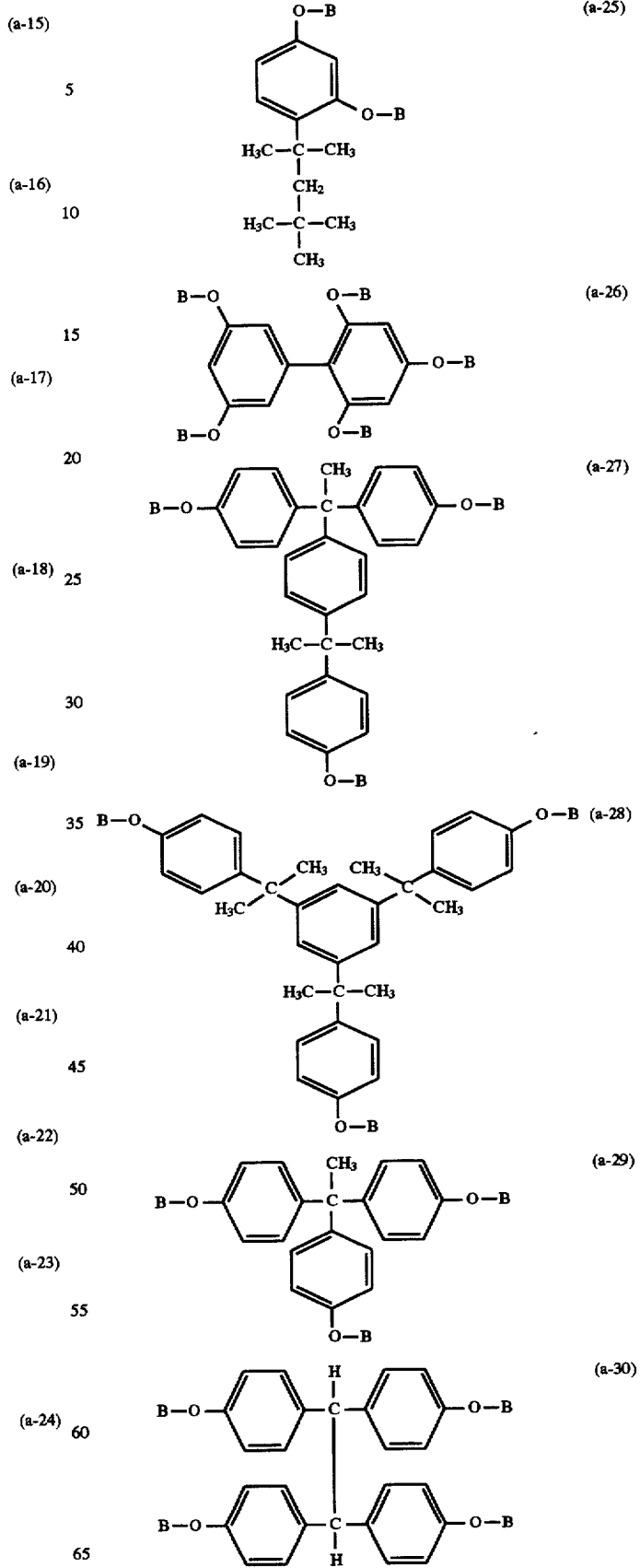

-continued

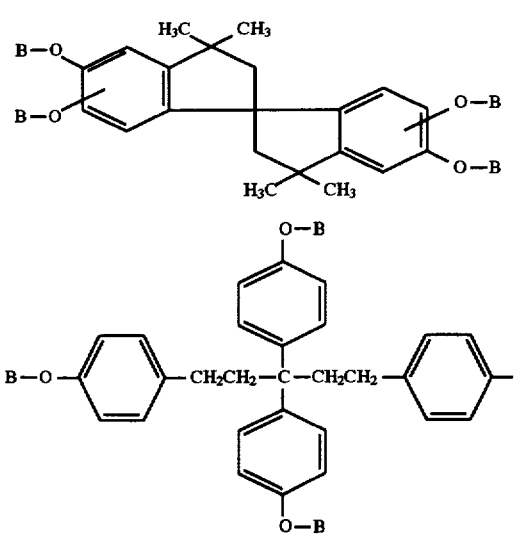

(a-31)

(a-32)

wherein A represents a hydrogen atom,

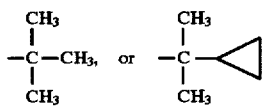

and B represents a group A or —CO—O—A, provided that at least one of the groups A and B present in a single molecule is a group other than hydrogen.

2. A positive working photosensitive composition which comprises:

(a) 0.5 to 80% by weight, based on the total weight of solids in the composition, of a compound which has (i) at least one group capable of being decomposed by an acid, said group being selected from the group consisting of tertiary alkyl ether groups, tertiary alkyl ester groups and tertiary alkyl carbonate groups, (ii) a molecular weight of not more than 1,200, and (iii) a boiling point of not less than 150° C.;

(b) 0.01 to 20% by weight, based on the total weight of solids in the composition, of a disulfone compound represented by the following formula (I):

$$R^1-SO_2-SO_2-R^2 \qquad (I);$$

wherein $R^1$ and $R^2$ independently represent a substituted or unsubstituted alkyl, alkenyl or aryl group; and (c) 5 to 99.49% by weight, based on the total weight of solids in the composition, of a resin insoluble in water and soluble in an alkaline water, wherein a film of the composition having a thickness of 1 μm has an optical density determined at 248 nm of not more than 1.4 before exposure to light and the optical density of the composition determined at 248 nm is reduced by exposure to light of 248 nm, wherein said composition further comprises one or more components selected from the group consisting of cyclic acid anhydrides for improving sensitivity, printing out agents for obtaining a visible image immediately after imagewise exposure, and fillers.

* * * * *